United States Patent
Tung et al.

(10) Patent No.: US 6,452,430 B1
(45) Date of Patent: Sep. 17, 2002

(54) PHASE-LOCKED LOOP CIRCUIT

(75) Inventors: Yen Chang Tung, Tainan; Alex Yu-Kwen Su, Hsin-Chuang, both of (TW)

(73) Assignee: Media Scope Technologies Corporation, Chung-Ho (TW)

( * ) Notice: Subject to any disclaimer, the term of this patent is extended or adjusted under 35 U.S.C. 154(b) by 0 days.

(21) Appl. No.: 09/934,473

(22) Filed: Aug. 23, 2001

(51) Int. Cl.[7] .................................................. H03B 5/24
(52) U.S. Cl. .................... 327/156; 327/158; 327/281; 331/57
(58) Field of Search .................. 327/158, 100, 327/306, 281, 288, 156; 331/57

(56) References Cited

U.S. PATENT DOCUMENTS 5,828,258 A * 10/1998 Ooishi et al. ................ 327/291
5,847,617 A * 12/1998 Reddy et al. ................ 327/158
6,054,904 A *  4/2000 Katoh et al. .................. 331/27

* cited by examiner

*Primary Examiner*—Dinh T. Le
(74) *Attorney, Agent, or Firm*—Bacon & Thomas

(57) ABSTRACT

MOS devices are added respectively to each stage of the voltage-controlled oscillator in a phase-locked loop circuit for improving the operating frequency range and the stability of middle/low frequency thereof, and for continuously and accurately adjusting the frequency.

2 Claims, 4 Drawing Sheets

PHASE-LOCKED LOOP CIRCUIT

FIELD OF THE INVENTION

The present invention relates to an improvement of a phase-locked loop circuit, and more particularly to an improved design of a phase-locked loop circuit for improving the operating frequency range and the stability of middle/low frequency thereof, and for adjusting accurately the frequency continuously.

BACKGROUND OF THE INVENTION

A conventional phase-locked loop circuit is shown in FIG. 1, in which a signal $f_{in}$ of some frequency is inputted into a divider 11 for being frequency divided by M to become a signal $f_{in/M}$, and then inputted into a phase frequency detector 12.

The phase frequency detector 12 will be inputted with another feedback signal $f_r$ having the same frequency with $f_{in/M}$. The signal $f_r$ is a modified reference signal for adjusting the phase of $f_{in/M}$. If the phase of $f_{in/M}$ is ahead of $f_r$, then the phase frequency detector 12 will generate an UP signal. If the phase of $f_{in/M}$ falls behind $f_r$, then the phase frequency detector 12 will generate a DN signal.

The UP signal or the DN signal will be inputted into a charge pump circuit 13 for generating a corresponding voltage $V_{ctrl}$ to be inputted into a low pass filter 14.

The output $V_o$ of the low pass filter 14 will be inputted into a voltage controlled oscillator 15 for generating an oscillating signal to be inputted into a prescaler circuit 16. After being processed by the prescaler circuit 16, an oscillating signal $f_o$ will be inputted into a divider 17 for generating a required accurate frequency.

The signal $f_o$ is also inputted into another divider 18 for being frequency divided by N to generate the signal $f_r$, and then inputted into the phase frequency detector 12. The frequency of $f_r$ is the same as that of $f_{in/M}$.

Referring to FIG. 2, the detailed circuit of the voltage-controlled oscillator 15 will be described. A voltage signal $V_M$ is inputted into the control terminals of the inverters 21, 22, 23, 24, 25 simultaneously. The inverters 21, 22, 23, 24, 25 are connected serially to form a ring, as shown in the figure. Capacitors $C_1$, $C_2$, $C_3$, $C_4$, $C_5$ are each parallelly connected at the output terminals a, b, c, d, e of the inverters. Therefore, oscillating signals having same frequency but different phases are each generated at the output terminals a, b, c, d, e of the inverters.

Referring to FIG. 3, which shows an improvement for the circuit in FIG. 2. The improvement is that capacitors C11, C12, C13, capacitors C21, C22, C23, capacitors C31, C32, C33, capacitors C41, C42, C43, and capacitors C51, C52, C53 are connected parallelly at the output terminals a, b, c, d, e of the inverters respectively. Signals CC1, CC2 and CC2 are used to enable switches S11, S12, S13, switches S21, S22, S23, switches S31, S32, S33, switches S41, S42, S43 and switches S51, S52, S53 that are connected serially with related capacitors respectively. By selecting signals CC1, CC2 or CC3 to turn related switches on and to enable related capacitors to become conductive, the frequency of the signals at the output terminals a, b, c, d, e can be adjusted.

Although the frequency of the signals at the output terminals a, b, c, d and e in FIG. 3 can be adjusted, the adjustment cannot be continuous. Another disadvantage is that the sensitivity of the frequency to voltage is too high in middle/low frequency range, so it is hard to do the frequency adjustment accurately.

OBJECTS OF THE INVENTION

It is therefore an object of the present invention to provide an improved design of a voltage-controlled oscillator of a phase-locked loop circuit for improving the operating frequency range and the stability of middle/low frequency therefore, and for adjusting accurately the frequency continuously.

DETAILED DESCRIPTION OF THE INVENTION

Figure 4:
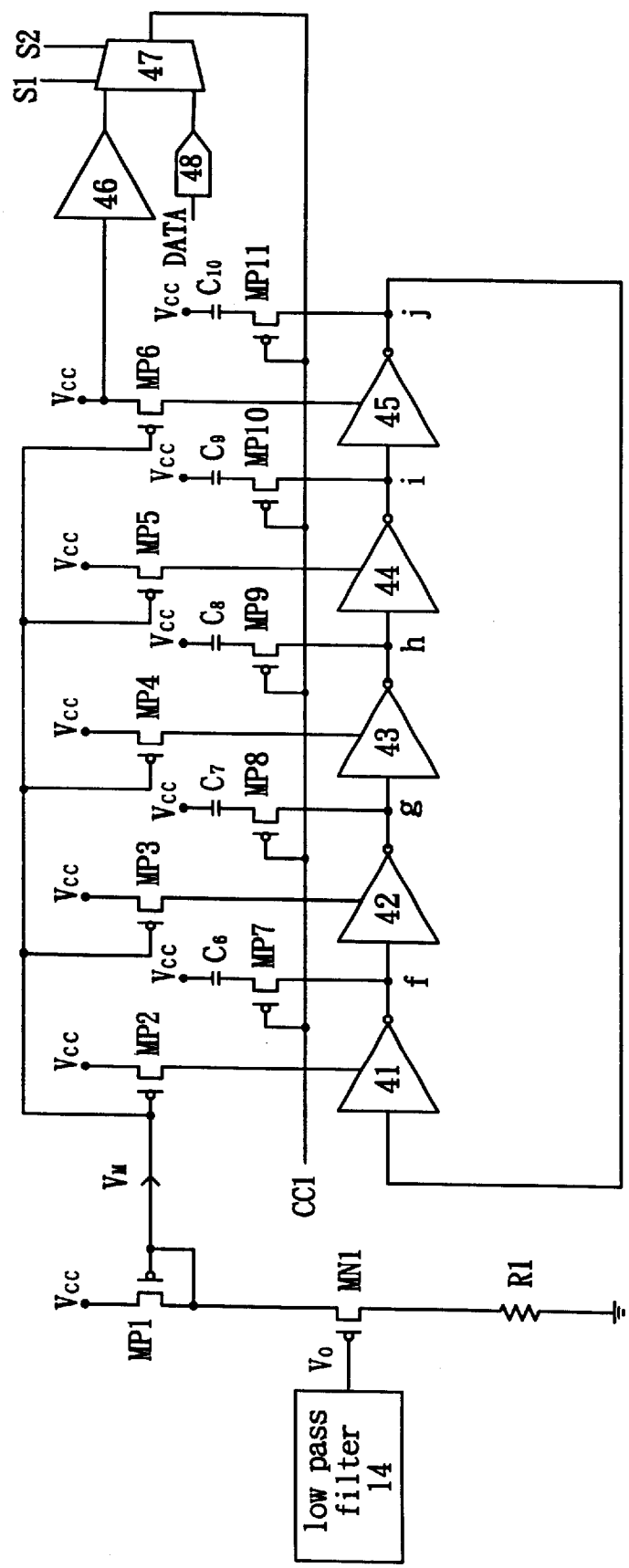
FIG. 4 shows an improved circuit design of the voltage-controlled oscillator in a phase-locked loop circuit according to the present invention.

Referring to FIG. 4, which shows an improved circuit design according to the present invention. The ouput voltage $V_o$ of the low pass filter 14 in the phase-locked loop circuit is inputted into the gate of an NMOS MN1. One terminal of the MN1 is connected with a resistor R1 to the ground, another terminal of the MN1 is connected with a PMOS MP1 to the Vcc. The gate of MP1 is connected with the connection between MP1 and MN1, as shown in the figure, thus a signal $V_M$ is generated at the gate of MP1.

$V_M$ is a voltage signal and will be inputted into the gate of each PMOS MP2, MP3, MP4, MP5 and MP6 in the voltage-controlled oscillator. One terminal of each PMOS MP2, MP3, MP4, MP5 and MP6 is connected with Vcc, while another terminal is connected with the control terminal of inverters 41, 42, 43, 44, 45 respectively. Inverters 41, 42, 43, 44, 45 are connected serially to form a ring, as shown in the figure. The output of MP6 is inputted into an amplifier 46, and the output of the amplifier 46 is inputted into a multiplexer 47. Another input terminal of the multiplexer 47 can be inputted with a voltage transferred from digital data DATA by a digital-to-analog converter 48. The multiplexer 47 has two switches S1 and S2 for selecting the output of either the amplifier 46 or the digital-to-analog converter 48 as the CC1 signal to be inputted simultaneously into the gate of each PMOS MP7, MP8, MP9, MP10 and MP11. One terminal of each PMOS MP7, MP8, MP9, MP10 and MP11 is connected respectively with capacious C6, C7, C8, C9 and C10 to the Vcc, while another terminal is connected respectively with the output points f, g, h, i, j of inverters 41, 42, 43, 44, 45. Thus, signals having a same frequency but different phases are generated respectively at the output points f, g, h, i, j of inverters 41, 42, 43, 44, 45.

Figure 1:
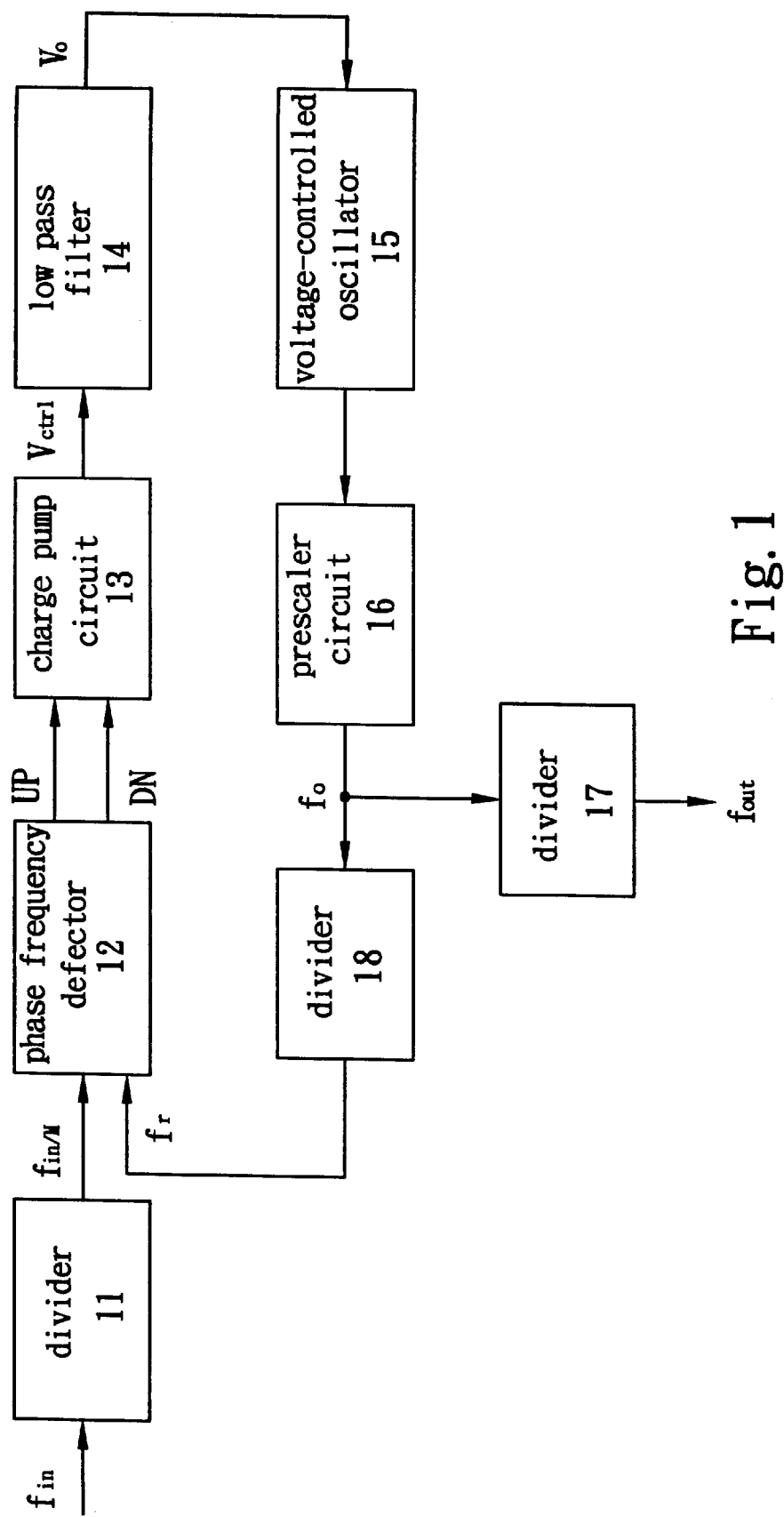
FIG. 1 shows the block diagram of a conventional phase-locked loop circuit.
Figure 2:
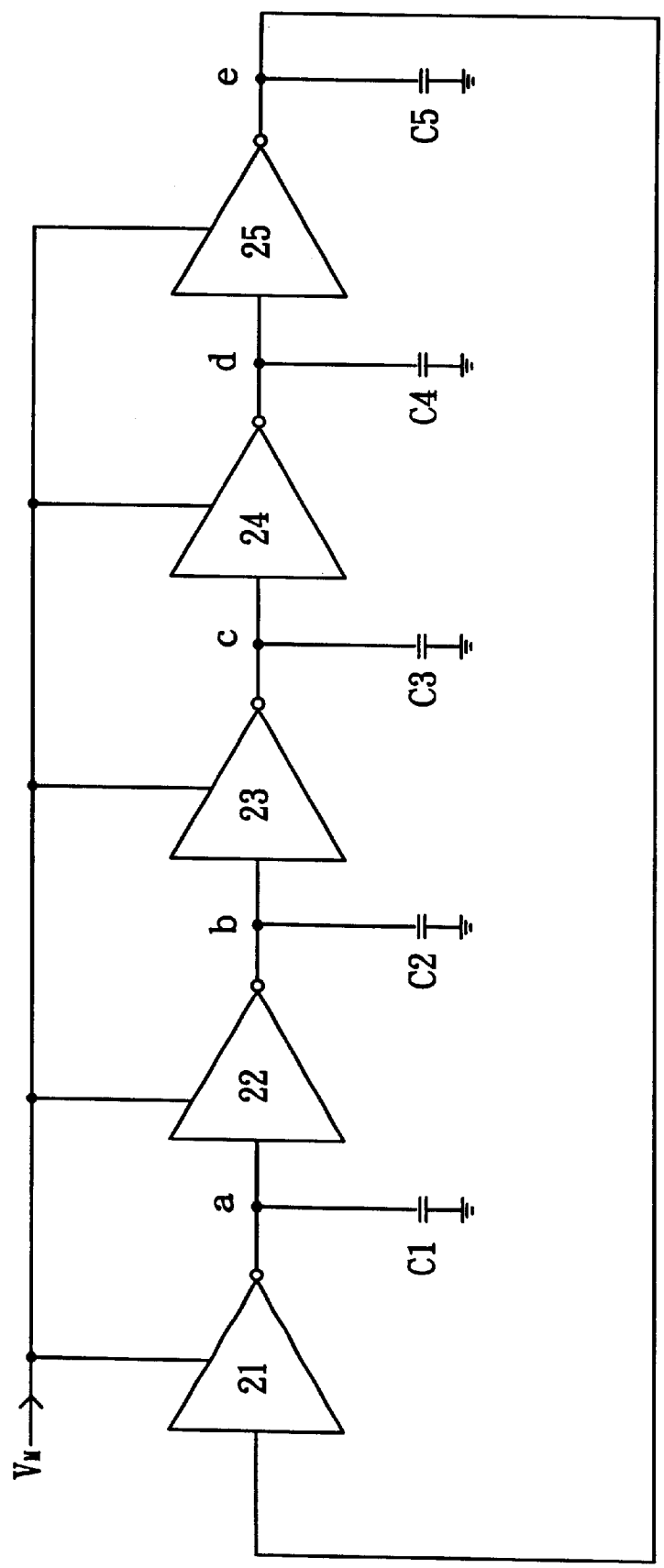
FIG. 2 shows the circuit diagram of the voltage-controlled oscillator in a conventional phase-locked loop circuit.
Figure 3:
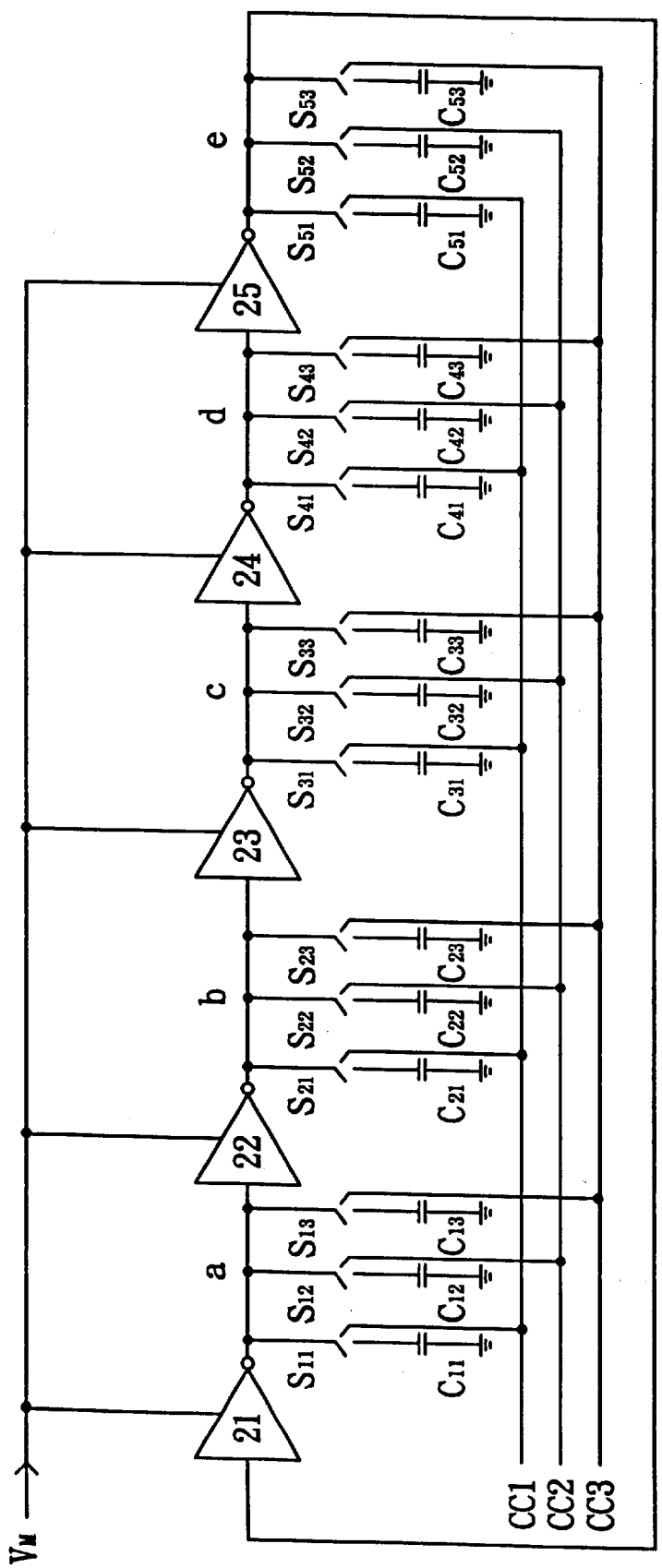
FIG. 3 shows a prior improved circuit design of the voltage-controlled oscillator in a conventional phase-locked loop circuit.

The voltage of the CC1 signal will control the width of the channel between the source and the drain of each PMOS MP7, MP8, MP9, MP10 and MP11. Therefore, current flowing through each of the channels is controlled and the frequency of the signals at points f, g, h, i, j can be adjusted. Since the voltage of the CC1 signal is varied continuously, the frequency of the signals at points f, g, h, i, j, which serve as output terminals for the voltage controlled oscillator and correspond to output terminals a, b, c, d, and e illustrated in FIG. 3 and described above.

The CC1 signal can be selected from outputs of the amplifier 46 or the digital-to-analog converter 48. If the output of the amplifier 46 is selected, then the voltage $V_M$ dominates. If the output of the digital-to-analog converter 48 is selected, then an external accurate digital signal DATA will dominate to adjust the frequency of the signals at points f, g, h, i, j.

Each of the inverters in the voltage-controlled oscillator according to the present invention can be replaced by a differential amplifier. Therefore, MOS devices and capacitors have to be connected at two sides of the differential amplifiers respectively to achieve the same effect as the above-mentioned embodiment.

The scope of the present invention depends only upon the following Claims, and is not limited by the above embodiment.

What is claimed is:

1. An improved voltage controlled oscillator for a phase-locked loop circuit, comprising:

a plurality of inverter circuits having output terminals, input terminals, and control terminals, each output terminal being connected to an input terminal of a next inverter circuit to form a ring, and said output terminals being respectively connected a voltage controlled oscillator output;

a plurality of input MOS circuits, each including a MOS transistor having a gate electrode connected to an input of the voltage controlled oscillator, said gate electrode being arranged to control a supply of voltage from a voltage source to respective said control terminals of the inverter circuits;

a plurality of capacitors connected to said output terminals of said inverter circuits to set said a frequency of said voltage controlled oscillator output;

a plurality of MOS circuits including current control MOS transistors, each current control transistor being connected in series between a voltage source and a respective one said capacitors; and a data input arranged to supply a control signal to control electrodes of said current control MOS transistors and thereby control currents supplied by said voltage sources to said plurality of capacitors, said digital data input thereby providing continuous control of said frequency.

2. An improved voltage controlled oscillator as claimed in claim 1, wherein said data input is a digital data input supplied to a first input of a multiplexer, a second input of the multiplexer being supplied by an output of a voltage amplifier connected to an output of one of said input MOS circuits, and an output of said multiplexer being connected to said control electrodes of said MOS transistors.

* * * * *